US006570437B2

(12) United States Patent
Park et al.

(10) Patent No.: US 6,570,437 B2
(45) Date of Patent: May 27, 2003

(54) BANDGAP REFERENCE VOLTAGE CIRCUIT

(75) Inventors: Joshua C. Park, Madford, MA (US); Xiaodong Wang, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/803,160

(22) Filed: Mar. 9, 2001

(65) Prior Publication Data

US 2002/0125937 A1 Sep. 12, 2002

(51) Int. Cl.[7] .................... H03L 5/08

(52) U.S. Cl. .................... 327/539; 327/538; 327/540

(58) Field of Search .................... 327/539, 538, 327/540, 541, 542, 530, 67; 323/312, 313, 314, 268

(56) References Cited

U.S. PATENT DOCUMENTS

| | | | | |
|---|---|---|---|---|
| 4,339,707 A | | 7/1982 | Gorecki | 323/313 |
| 4,857,823 A | | 8/1989 | Bitting | 323/314 |
| 5,087,830 A | | 2/1992 | Cave et al. | 327/539 |
| 5,367,249 A | * | 11/1994 | Honnigford | 323/313 |
| 5,545,978 A | | 8/1996 | Pontius | 323/513 |
| 5,801,553 A | * | 9/1998 | Danstrom | 327/67 |
| 6,294,902 B1 | * | 9/2001 | Moreland et al. | 323/268 |

* cited by examiner

*Primary Examiner*—Tuan T. Lam
*Assistant Examiner*—Hiep Nguyen
(74) *Attorney, Agent, or Firm*—Joseph P. Abate; Ratner & Prestia

(57) ABSTRACT

A bandgap reference voltage circuit having a bandgap start-up circuit for initiating operation of the bandgap reference voltage circuit, a bandgap core circuit for developing a bandgap reference voltage, and a bandgap output circuit for supplying a bandgap reference voltage. The bandgap start-up circuit is connected to a low impedance leg in the bandgap core circuit and the bandgap output circuit has a feedback circuit that is connected to a high impedance leg in the bandgap core circuit. The connection of the bandgap start-up circuit to the low impedance leg of the bandgap core circuit eliminates the possibility of metastable operation of the bandgap reference voltage circuit. This bandgap reference voltage circuit can be used in battery powered units having reduced supply voltages as low as, for example, 1.7V and the arrangement of the feedback circuit of the bandgap output circuit allows supplying of reference voltages greater and less than typical bandgap voltage.

7 Claims, 1 Drawing Sheet

BANDGAP REFERENCE VOLTAGE CIRCUIT

TECHNICAL FIELD

The present invention relates, in general, to electrical circuits that provide reference voltages and, in particular, to bandgap reference voltage circuits that are substantially insensitive to temperature and avoid undesirable metastable operation.

BACKGROUND OF THE INVENTION

Bandgap reference voltage circuits are used in Bipolar and BICMOS circuit designs for producing stable reference voltages for biasing circuits. The stable reference voltages are used to control other voltage levels within a chip and to provide bias currents that are proportional to absolute temperature.

Circuits that regulate voltage and provide bias current are used extensively in analog units such as cellular telephones. A bandgap reference voltage circuit in a cellular telephone must not only provide the required voltage regulation and bias current, but also must be power efficient because cellular telephone circuits are powered by batteries. The bandgap reference voltage circuit is integral to the operation of the cellular telephone circuits, so reliability of the bandgap reference voltage circuit is essential to avoid catastrophic failure.

Normally, bandgap reference voltage circuits have two operating states. The first operating state provides normal operation that produces the required regulated voltage or bias current. The second operating state is a zero current state, which means that the bandgap reference voltage circuit is not operational. Some bandgap reference voltage circuits have a third operating state which is the metastable state representing a circuit failure.

One of the more common problems with bandgap reference voltage circuits is the failure of the circuit to enter the normal operational state from the zero state. If the bandgap reference voltage circuit enters the metastable state, the output voltage does not attain a final reference value and the circuit might remain in the metastable state, with the result that the entire cellular telephone unit might fail.

A solution to this problem is to provide additional start-up circuitry that forces the bandgap reference voltage circuit into its normal operating state (i.e., the first operating state identified above). Additional start-up circuitry, however, adds load to the battery power supply and this can decrease power efficiency.

For silicon-based technology, the bandgap voltage typically is 1.2V. This bandgap voltage also is used to generate a proportional to absolute temperature (PTAT) current for analog circuits. Sometimes, a reference voltage greater or less than 1.2V is desired to adjust the temperature coefficient of the PTAT current. This facility is important in optimizing circuit performance.

Another consideration in the design of bandgap reference voltage circuits is the current trend to reduce the supply voltage in battery operated units. As the supply voltage is reduced, for example, from 3V to 2.2V, the bandgap reference voltage circuits are likely to not function properly with the result that the bandgap reference voltages will decrease with the decreases in the supply voltage.

SUMMARY OF THE INVENTION

To overcome the shortcomings of prior art bandgap reference voltage circuit a new and improved bandgap reference voltage circuit is provided by the present invention.

It is an objective of the present invention to provide a new and improved bandgap reference voltage circuit.

It is another objective of the present invention to provide a bandgap reference voltage circuit that minimizes greatly metastable operation.

It is a further objective of the present invention to provide a bandgap reference voltage circuit that can operate properly with reductions in the supply voltage.

It is yet another objective of the present invention to provide a bandgap reference voltage circuit that develops reference voltages greater and less than the bandgap reference voltage.

A bandgap reference voltage circuit, constructed in accordance with the present invention, includes a bandgap start-up circuit for initiating operation of the bandgap reference voltage circuit, a bandgap core circuit for developing a bandgap reference voltage, and a bandgap output circuit for supplying a bandgap reference voltage. The bandgap core circuit has a low impedance leg to which bandgap start-up circuit is connected and a high impedance leg to which the bandgap output circuit is connected. The bandgap output circuit has a feedback circuit connected to the high impedance leg of the bandgap core circuit.

It is to be understood that the foregoing general description of the present invention and the following detailed description of the present invention are exemplary, but are not restrictive of the invention.

BRIEF DESCRIPTION OF THE DRAWING

The single

DETAILED DESCRIPTION OF THE INVENTION

Figure 1:
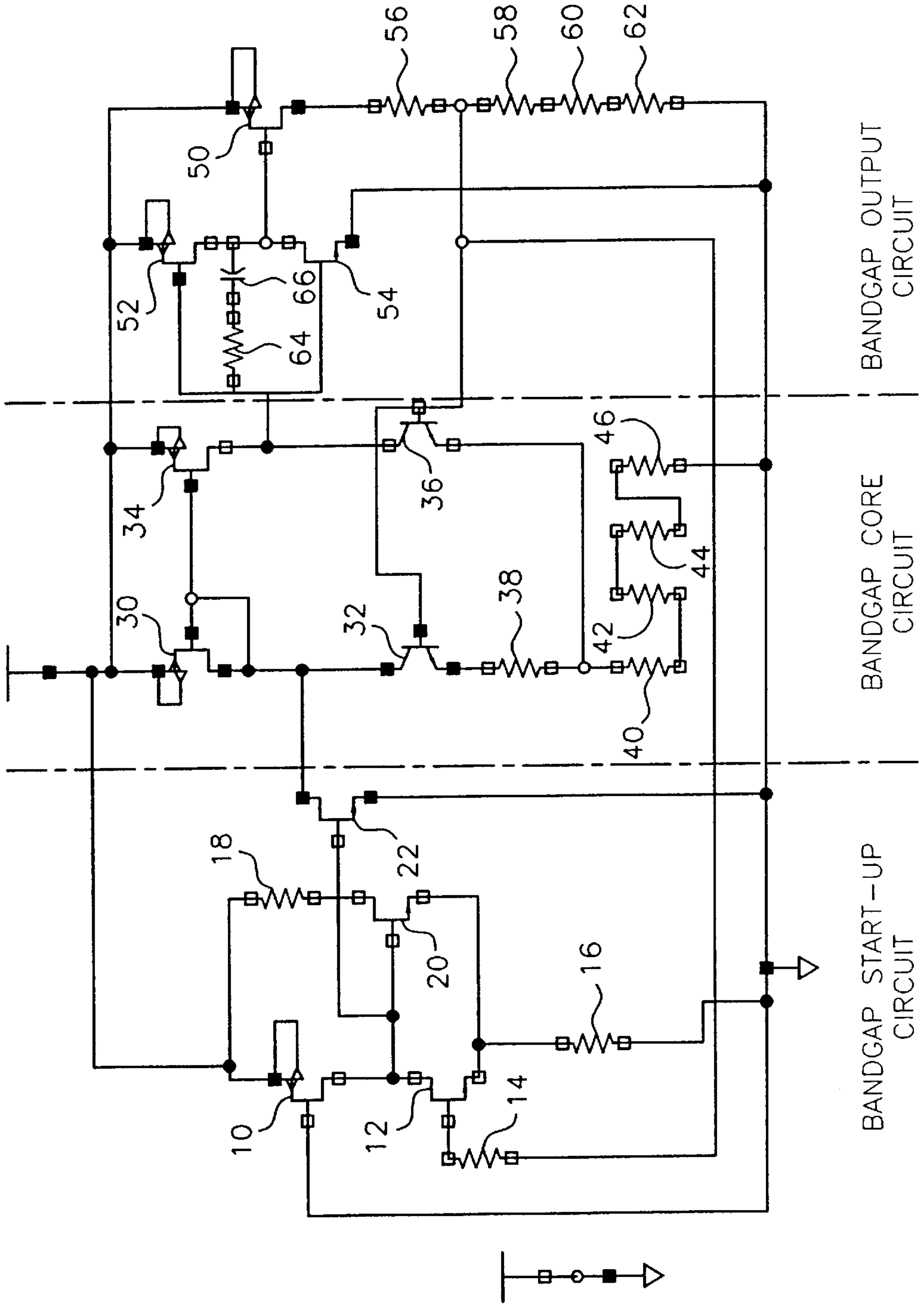
FIG. 1 is a circuit diagram of a preferred embodiment of a bandgap reference voltage circuit constructed in accordance with the present invention.

Referring to the drawing, a bandgap reference voltage circuit, constructed in accordance with the present invention, has three major parts: a BANDGAP START-UP CIRCUIT, a BANDGAP CORE CIRCUIT, and a BANDGAP OUTPUT CIRCUIT. The BANDGAP START-UP CIRCUIT initiates operation of the bandgap reference voltage circuit. The BANDGAP CORE CIRCUIT develops a bandgap reference voltage. The BANDGAP OUTPUT CIRCUIT supplies a bandgap reference voltage and, in accordance with the present invention, develops and supplies a voltage greater than the bandgap reference voltage and a voltage less than the bandgap reference voltage.

The BANDGAP START-UP CIRCUIT that is illustrated includes a PFET 10, an NFET 12, a resistor 14, a resistor 18, and an NFET 20. These components form an inverter with hysteresis a low threshold voltage. The BANDGAP START-UP CIRCUIT also includes an NFET 22.

If the bandgap reference voltage circuit is in the zero current mode, the bandgap voltage $V_{bg}$ is low, for example 0.4V. The output of the inverter, therefore, is high which turns on NFET 22. This will lower the voltage on the gate/drain of PFET 30 and initiates the current mirror operation. This process will iterate until the normal operation mode is established and the bandgap voltage $V_{bg}$ reaches the desired level, for example 1.2V. At this point, with the input to the inverter in the BANDGAP START-UP CIRCUIT high, the output of this inverter is low and NFET 22 is off. There is no current flow in the BANDGAP START-UP CIRCUIT when it is not in use.

The BANDGAP CORE CIRCUIT that is illustrated includes a low impedance leg to which the BANDGAP START-UP CIRCUIT is connected. The low impedance leg of the BANDGAP CORE CIRCUIT includes a PFET 30 that is connected as a diode and a transistor 32 connected to the diode connected PFET 30. By connecting PFET 30 as a diode, the junction of the diode connected PFET 30 and the transistor 32 is a low impedance node. The BANDGAP START-UP CIRCUIT is connected to the junction of the diode connected PFET 30 and the collector of transistor 32.

The BANDGAP CORE CIRCUIT that is illustrated also includes a high impedance leg to which the BANDGAP OUTPUT CIRCUIT is connected. The high impedance leg of the BANDGAP CORE CIRCUIT includes a PFET 34 and a transistor 36.

The BANDGAP CORE CIRCUIT that is illustrated further includes a plurality of resistors 38, 40, 42, 44, and 46 connected between the emitter of transistor 32 and ground. The emitter of transistor 36 is connected to the junction of resistors 38 and 40.

PFET 30 and PFET 34 are selected to be identical so that the currents flowing through the low impedance leg and the high impedance leg of the BANDGAP CORE CIRCUIT are equal. The sizes of the emitters of transistor 32 and the emitter of transistor 36 are selected to be ratioed so that the current I flowing through resistor 38 is proportional to $\Delta V_{be}$ and inversely proportional to the resistance of resistor 38. Resistors 38, 40, 42, 44, and 46 are selected to be equal to represent, for the circuit illustrated, a 4:1 ratio. The voltage at the base of transistors 32 and 36 is determined by $$V_{be}(\text{transistor } 36)+2*I*(R_{40}+R_{42}+R_{44}+R_{46})$$

With the proper ratio of the emitter sizes of the two transistor 32 and 36, the output voltage will be the bandgap voltage $V_{bg}$.

The BANDGAP OUTPUT CIRCUIT that is illustrated includes a feedback circuit connected to the high impedance leg of the BANDGAP CORE CIRCUIT. In particular, the feedback circuit of the BANDGAP OUTPUT CIRCUIT includes two stages of amplification, namely a PFET 50 as one stage of amplification and an inverter amplifier, composed of a PFET 52 and an NFET 54, as the other stage of amplification. The inverter amplifier is connected between PFET 50 and the junction of the drain of PFET 34 of the high impedance leg of the BANDGAP CORE CIRCUIT and the collector of transistor 36 of the high impedance leg of the BANDGAP CORE CIRCUIT.

The BANDGAP OUTPUT CIRCUIT further includes a plurality of series-connected resistors 56, 58, 60, and 62 connected between ground and PFET 50 for developing the bandgap reference voltage $V_{bg}$, a voltage greater than the bandgap reference voltage, and a voltage less than the bandgap reference voltage. In particular, the bandgap reference voltage $V_{bg}$ is developed at the junction of resistors 56 and 58, a voltage greater than the bandgap reference voltage is developed at the junction of resistor 56 and PFET 50, and voltages less than the bandgap reference voltage are developed at the junction of resistors 58 and 60 and the junction of resistors 60 and 62. The bandgap reference voltage $V_{bg}$, is typically 1.2 volts, the voltage greater than the bandgap reference voltage that is developed at the junction of resistor 56 and PFET 50 can be 1.6 volts, and the voltages less than the bandgap reference voltage that are developed at the junction of resistors 58 and 60 and the junction of resistors 60 and 62 can be 0.8 volts and 0.4 volts, respectively.

The BANDGAP OUTPUT CIRCUIT further includes resistor 64 and a capacitor 66 that aide in stabilizing the feedback circuit.

The inverter amplifier, composed of PFET 52 and NFET 54, inverts the signal at the junction of the drain of PFET 34 of the high impedance leg of the BANDGAP CORE CIRCUIT and the collector of transistor 36 of the high impedance leg of the BANDGAP CORE CIRCUIT. PFET 50 inverts the output signal from inverter amplifier and the output signal of PFET 50 is conducted through resistor 56 to the base of transistor 36 and to the base of transistor 32. The feedback circuit is completed by the connection of the collector of transistor 36 to the inverter amplifier.

The identification of the two legs of the BANDGAP CORE CIRCUIT as "high impedance" and "low impedance" is for the purpose of establishing that one leg has a lower impedance than the other leg. By connecting the BANDGAP START-UP CIRCUIT to the low impedance leg of the BANDGAP CORE CIRCUIT, there is a faster response to the output of the BANDGAP START-UP CIRCUIT by the BANDGAP CORE CIRCUIT, thereby eliminating the possibility of metastable operation.

Although illustrated and described above with reference to certain specific embodiments, the present invention nevertheless is not intended to be limited to the details shown. Rather, various modifications may be made in the details within the scope and range of equivalents of the claims and without departing from the spirit of the invention.

What is claimed:

1. A bandgap reference voltage circuit, comprising:

a bandgap start-up circuit for initiating operation of the bandgap reference voltage circuit;

a bandgap core circuit for developing a bandgap reference voltage and having:

(a) a low impedance leg to which said bandgap start-up circuit is connected; and (b) a high impedance leg; and a bandgap output circuit for supplying the bandgap reference voltage and having a feedback circuit connected to said high impedance leg of said bandgap core circuit; wherein (i) said low impedance leg of said bandgap core circuit includes a connected FET and a transistor connected to said diode connected FET, (ii) said bandgap start-up circuit is connected to the junction of said diode connected FET of said low impedance leg of said bandgap core circuit and said transistor of said low impedance leg of said bandgap core circuit, (iii) said high impedance leg of said bandgap core circuit includes a FET having a drain and a transistor having a collector, and (iv) said feedback circuit of said bandgap output circuit is connected to said drain of said FET of said high impedance leg of said bandgap core circuit and said collector of said transistor of said high impedance leg of said bandgap core circuit, and said feedback circuit of said bandgap output circuit includes two stages of amplification.

2. A bandgap reference voltage circuit, comprising:

a bandgap start-up circuit for initiating operation of the bandgap reference voltage circuit;

a bandgap core circuit for developing a bandgap reference voltage and having:

(a) a low impedance leg to which said bandgap start-up circuit is connected, and (b) a high impedance leg; and a bandgap output circuit for supplying the bandgap reference voltage and having a feedback circuit connected to said high impedance leg of said bandgap core circuit; wherein said high impedance leg of said bandgap core circuit includes a FET having a drain and a transistor having a collector, and said feedback circuit of said bandgap output circuit is connected to said drain of said FET of said high impedance leg of said bandgap core circuit and said collector of said transistor of said high impedance leg of said bandgap core circuit, and said feedback circuit of said bandgap output circuit includes two stages of amplification; wherein said bandgap output circuit further includes a plurality of series-connected resistors connected between ground and one of said two stages of amplification for developing:

(a) the bandgap reference voltage, (b) a voltage greater than the bandgap reference voltage, and (c) a voltage less than the bandgap reference voltage.

3. A bandgap reference voltage circuit according to claim 1 wherein said bandgap output circuit further includes a plurality of series-connected resistors connected between ground and one of said two stages of amplification for developing:

(a) the bandgap reference voltage, (b) a voltage greater than the bandgap reference voltage, and (c) a voltage less than the bandgap reference voltage.

4. A bandgap reference voltage circuit according to claim 1 wherein the other of said two stages of amplification is connected between said one of said two stages of amplification and said drain of said FET of said high impedance leg of said bandgap core circuit and said collector of said transistor of said high impedance leg of said bandgap core circuit.

5. A bandgap reference voltage circuit according to claim 2 wherein the other of said two stages of amplification is connected between said one of said two stages of amplification and said drain of said FET of said high impedance leg of said bandgap core circuit and said collector of said transistor of said high impedance leg of said bandgap core circuit.

6. A bandgap reference voltage circuit according to claim 4 wherein said other of said two stages of amplification is an inverter amplifier.

7. A bandgap reference voltage circuit according to claim 5 wherein said other of said two stages of amplification is an inverter amplifier.

* * * * *